(12) United States Patent
Park et al.

(10) Patent No.: US 12,389,765 B2
(45) Date of Patent: Aug. 12, 2025

(54) DISPLAY DEVICE HAVING A HOLE FORMED IN A DISPLAY AREA

(71) Applicant: Samsung Display Co., LTD., Yongin-si (KR)

(72) Inventors: Hyungjun Park, Seoul (KR); Taehoon Kwon, Suwon-Si (KR); Min Jeong Kim, Hwaseong-si (KR); Jun-Yong An, Asan-si (KR); Nuree Um, Hwaseong-si (KR); Wonkyu Kwak, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 394 days.

(21) Appl. No.: 17/471,069

(22) Filed: Sep. 9, 2021

(65) Prior Publication Data

US 2022/0223677 A1    Jul. 14, 2022

(30) Foreign Application Priority Data

Jan. 14, 2021   (KR) .......................... 10-2021-0005046

(51) Int. Cl.
*H10K 59/131*   (2023.01)

(52) U.S. Cl.
CPC .................. *H10K 59/131* (2023.02)

(58) Field of Classification Search
CPC ...... H10K 59/131; H10K 59/00; H10K 59/12; H10K 59/1213; H10K 59/1216; G09G 3/3225
USPC ........................................................ 257/40
See application file for complete search history.

(56) References Cited

U.S. PATENT DOCUMENTS

| | | |
|---|---|---|
| 10,134,826 B2 | 11/2018 | Ka et al. |
| 10,553,663 B2 | 2/2020 | Choi et al. |
| 2018/0219025 A1* | 8/2018 | Takahashi ............ G09G 3/3659 |
| 2020/0110498 A1 | 4/2020 | Lee et al. |

(Continued)

FOREIGN PATENT DOCUMENTS

| | | |
|---|---|---|
| KR | 10-2017-0117291 | 10/2017 |
| KR | 10-2018-0080741 | 7/2018 |

(Continued)

OTHER PUBLICATIONS

Korean Office Action dated Jun. 26, 2025, in Korean Patent Application No. 10-2021-0005046.

*Primary Examiner* — Fernando L Toledo
*Assistant Examiner* — Laura M Dykes
(74) *Attorney, Agent, or Firm* — KILE PARK REED & HOUTTEMAN PLLC

(57) ABSTRACT

A display device including a substrate, a plurality of first data lines and a plurality of second data lines. The substrate includes a display area, in which a hole is formed, and a hole edge area surrounding the hole. The plurality of first data lines are disposed on the substrate, extend in a first direction in the display area, are arranged in a second direction orthogonal to the first direction, and bypass the hole along the hole edge area. The plurality of second data lines are disposed on the substrate, extend in the first direction in the display area, are arranged adjacent to the plurality of first data lines, and bypass the hole along hole edge area. In the hole edge area, each of the plurality of first data lines and the plurality of second data lines are disposed on three layers different from each other.

20 Claims, 9 Drawing Sheets

(56) References Cited

U.S. PATENT DOCUMENTS

| | | | |
|---|---|---|---|
| 2020/0144352 A1 | 5/2020 | Lee et al. | |
| 2020/0176527 A1 | 6/2020 | An et al. | |
| 2020/0403057 A1* | 12/2020 | Kang | G09G 3/3233 |
| 2021/0335988 A1* | 10/2021 | Um | G06F 3/0202 |
| 2022/0157233 A1* | 5/2022 | Zheng | G09G 3/3208 |
| 2022/0199748 A1* | 6/2022 | Kim | H10K 59/131 |

FOREIGN PATENT DOCUMENTS

| | | |
|---|---|---|
| KR | 10-2019-0042899 | 4/2019 |
| KR | 10-2020-0039860 | 4/2020 |
| KR | 10-2020-0051108 | 5/2020 |
| KR | 10-2020-0066502 | 6/2020 |

* cited by examiner

DISPLAY DEVICE HAVING A HOLE FORMED IN A DISPLAY AREA

CROSS-REFERENCE TO RELATED APPLICATION

This application claims priority from and the benefit of Korean Patent Application No. 10-2021-0005046, filed on Jan. 14, 2021, which is hereby incorporated by reference for all purposes as if fully set forth herein.

BACKGROUND

Field

Embodiments of the invention relate generally to a display device. More particularly, embodiments relate to a display device in which a hole is formed in a display area.

Discussion of the Background

A display device may include a display area in which an image is displayed and a non-display area positioned outside the display area. Pixels for displaying an image and lines connected to the pixels may be disposed in the display area. Drivers for driving the pixels and functional modules, such as a camera module and a sensor module, may be disposed in the non-display area.

A hole may be formed in the display area to reduce dead space caused by the non-display area. The functional module may be disposed on a lower surface of the display device to correspond to the hole, and the functional module may detect or recognize an object or a user located in front of the display device through the hole. When the hole is formed in the display area, lines disposed in the display area may bypass the hole. Accordingly, lines are disposed adjacent to the edge of the hole so that an image is not displayed, and a hole edge area surrounding the hole may be formed.

The above information disclosed in this Background section is only for understanding of the background of the inventive concepts, and, therefore, it may contain information that does not constitute prior art.

SUMMARY

Embodiments provide a display device in which a hole is formed in a display area.

Additional features of the inventive concepts will be set forth in the description which follows, and in part will be apparent from the description, or may be learned by practice of the inventive concepts.

An embodiment of the invention provides a display device including a substrate, a plurality of first data lines and a plurality of second data lines. The substrate includes a display area, in which a hole is formed, and a hole edge area surrounding the hole. The plurality of first data lines are disposed on the substrate; extend in a first direction in the display area; are arranged in a second direction orthogonal to the first direction; and bypass the hole along the hole edge area. The plurality of second data lines are disposed on the substrate; extend in the first direction in the display area; are arranged adjacent to the plurality of first data lines; and bypass the hole along hole edge area. In the hole edge area, each of the plurality of first data lines and the plurality of second data lines are disposed on three layers different from each other.

In the hole edge area, the plurality of first data lines may overlap with each other on a plane, and the plurality of second data lines may overlap with each other on the plane.

In the hole edge area, the plurality of first data lines may be aggregated with each other, and the plurality of second data lines may be aggregated with each other.

Each of the plurality of first data lines may be connected to one side or another side of each of a plurality of first pixels arranged in a first row of the display area. Each of the plurality of second data lines may be connected to one side or another side of each of a plurality of second pixels arranged in a second row positioned in the first direction from the first row of the display area.

In the hole edge area, at least one of the plurality of first data lines may cross at least one of the plurality of second data lines.

The hole may have a circular shape. The hole edge area may have a circular annular shape.

Each of the plurality of first data lines and the plurality of second data lines may include a first line disposed on the substrate, a second line disposed on the first line, and a third line disposed on the second line.

The first line, the second line, and the third line may extend in the first direction, and may be repeatedly arranged in an order of the first line, the second line, and the third line along the second direction.

The display device may further include a metal layer disposed in the display area on the substrate, an active layer disposed on the metal layer, a gate electrode disposed on the active layer, a capacitor electrode disposed on the gate electrode, a drain electrode disposed on the capacitor electrode and connected to the active layer, and a connection electrode disposed on the drain electrode and connected to the drain electrode.

In the hole edge area, the first line may be disposed on a same layer as the metal layer, the second line may be disposed on a same layer as the drain electrode, and the third line may be disposed on a same layer as the connection electrode.

The display device may further include an initialization voltage line. The initialization voltage line may be disposed on the substrate, may extend in the second direction in the display area, and may bypass the hole along the hole edge area.

In the hole edge area, the initialization voltage line may be disposed on a same layer as the capacitor electrode.

The display device may further include a scan line. The scan line may be disposed on the substrate, may extend in the second direction in the display area, and may bypass the hole along the hole edge area.

In the hole edge area, the scan line may be disposed on a same layer as the gate electrode.

Another embodiment of the invention provides a display device including a substrate, a plurality of first data lines, and a plurality of second data lines. The substrate includes a display area, in which a hole is formed, and a hole edge area surrounding the hole. The plurality of first data lines are disposed on the substrate; extend in a first direction in the display area; are arranged in a second direction orthogonal to the first direction; and bypass the hole along the hole edge area. The plurality of second data lines are disposed on the substrate; extend in the first direction in the display area; are arranged adjacent to the plurality of first data lines; and bypass the hole along hole edge area. In the hole edge area, each of the plurality of first data lines and the plurality of second data lines are disposed on four layers different from each other.

Each of the plurality of first data lines may be connected to one side or another side of each of a plurality of first pixels arranged in a first row of the display area. Each of the plurality of second data lines may be connected to one side or another side of each of a plurality of second pixels arranged in a second row located in the first direction from the first row of the display area.

Each of the plurality of first data lines and the plurality of second data lines may include a first line disposed on the substrate, a second line disposed on the first line, a third line disposed on the second line, and a fourth line disposed on the third line.

The first line, the second line, the third line, and the fourth line may extend in the first direction in the display area, and may be repeatedly arranged in an order of the first line, the second line, the third line, and third line, and the fourth line.

The display device may further include a metal layer disposed in the display area on the substrate, an active layer disposed on the metal layer, a gate electrode disposed on the active layer, a capacitor electrode disposed on the gate electrode, a drain electrode disposed on the capacitor electrode and connected to the active layer, and a connection electrode disposed on the drain electrode and connected to the drain electrode.

In the hole edge area, the first line may be disposed on a same layer as the metal layer, the second line may be disposed on a same layer as the capacitor electrode, the third line may be disposed on a same layer as the drain electrode, and the fourth line may be disposed on a same layer as the connection electrode.

In the display device according to embodiments, in a hole edge area, as each of first data lines and second data lines is disposed on three different layers from each other, an area occupied by the first data lines and the second data lines in the hole edge area may be reduced. Accordingly, a dead space of the display device may be reduced.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
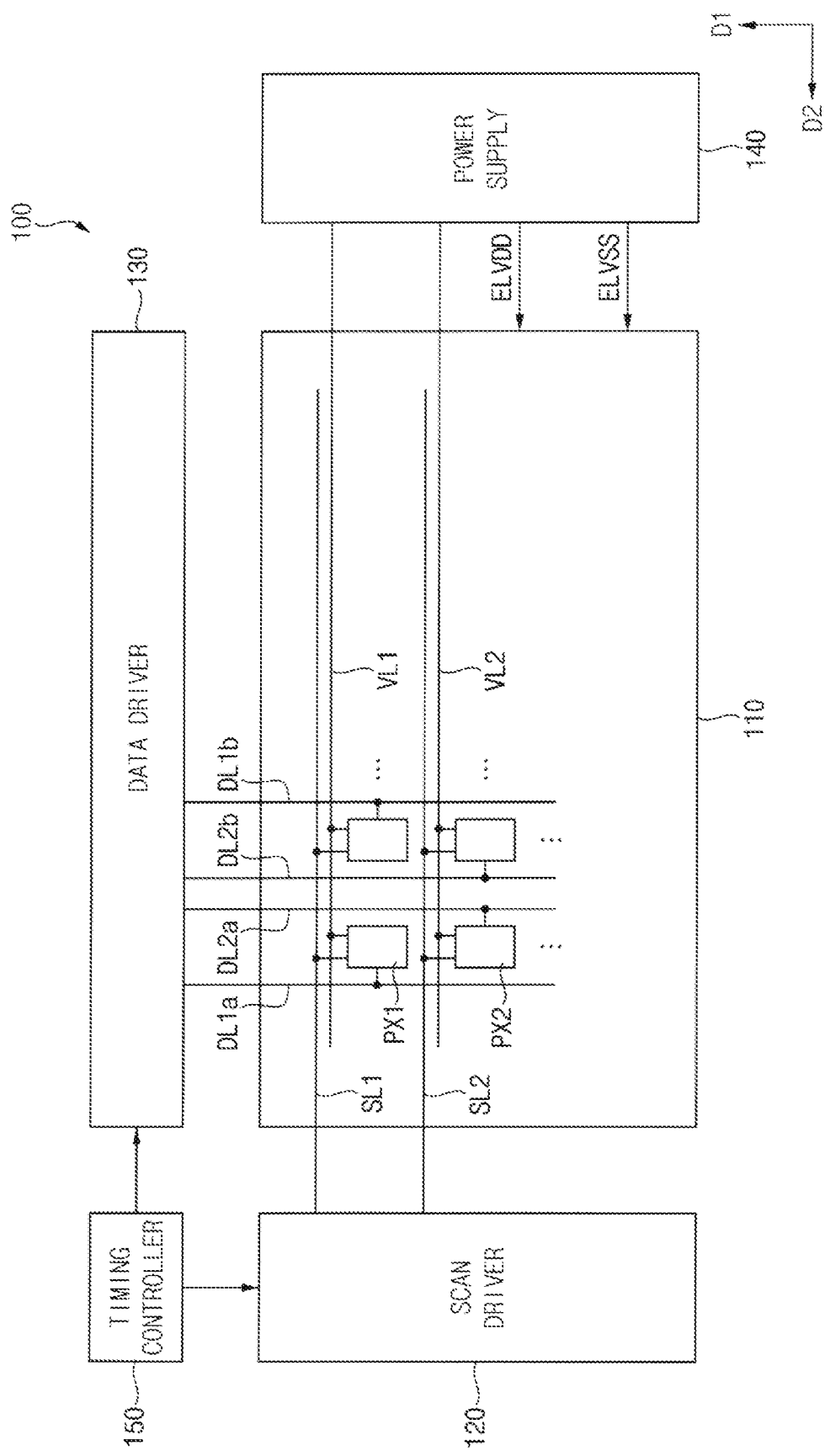
FIG. 1 is a block diagram illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram illustrating a display device according to an embodiment.'

Referring to FIG. 1, the display device 100 according to an embodiment may include a display portion 110, a scan driver 120, a data driver 130, and a power supply 140, a timing controller 150, and the like. The display portion 110 may be located at an intersection of a plurality of scan lines SL1 and SL2, a plurality of first data lines DL1a and DL1b, a plurality of second data lines DL2a and DL2b, and a plurality of initialization voltage lines VL1 and VL2. The display portion 110 may include a plurality of first pixels PX1 and a plurality of second pixels PX2 arranged in a substantially matrix form. The plurality of scan lines SL1 and SL2 and the plurality of initialization voltage lines VL1 and VL2 may generally extend in a row direction, and the plurality of first data lines DL1a and DL1b and the plurality of second data lines DL2a and DL2b may generally extend in a column direction.

The pixels PX1 and PX2 may be connected to the scan lines SL1 and SL2, the first data lines DL1a and DL1b, the second data lines DL2a and DL2b, and the initialization voltage lines VL1 and VL2. The pixels PX1 and PX2 may include the plurality of first pixels PX1 and the plurality of second pixels PX2. According to an embodiment, the plurality of first data lines DL1a and DL1b may be connected to one side or another side of each of the plurality of first pixels PX1 arranged in a first row, and the plurality of second data lines DL2a and DL2b may be connected to one side or another side of each of the plurality of second pixels PX2 arranged in a second row located in a first direction D1 from the first row. For example, each of the plurality first pixels PX1 and the plurality of second pixels PX2 may display any one color of red, green, and blue.

The scan driver 120 may be connected to the scan lines SL1 and SL2. The scan lines SL1 and SL2 may include a plurality of first scan lines SL1 and a plurality of second scan lines SL2. The scan driver 120 may transmit a scan signal to the plurality of pixels PX1 and PX2 through the plurality of scan lines SL1 and SL2.

The data driver 130 may be connected to the plurality of first data lines DL1a and DL1b and the plurality of second data lines DL2a and DL2b. The data driver 130 may transmit data signals to the plurality of first pixels PX1 through the plurality of first data lines DL1a and DL1b. The data driver 130 may transmit data signals to the plurality of second pixels PX2 through the plurality of second data lines DL2a and DL2b.

The data signals may be supplied to the plurality of pixels PX1 and PX2 selected by the scan signals whenever the scan signals are supplied to the plurality of scan lines SL1 and SL2.

The plurality of pixels PX1 and PX2 may receive a driving voltage ELVDD and a common voltage ELVSS from the power supply 140. The driving voltage ELVDD may be a predetermined high level voltage and the common voltage ELVSS may be a voltage lower than the driving voltage ELVDD or a ground voltage. In addition, the power supply 140 may be connected to the plurality of initialization voltage lines VL1 and VL2. The initialization voltage lines VL1 and VL2 may include a plurality of first initialization voltage lines VL1 and a plurality of second initialization voltage lines VL2. The power supply 140 may provide an initialization voltage to the plurality of pixels PX1 and PX2 through the plurality of initialization voltage lines VL1 and VL2.

The timing controller 150 may convert image signals transmitted from an outside source into image data signals and transmit the image data signals to the data driver 130. In addition, the timing controller 150 may receive a vertical synchronization signal, a horizontal synchronization signal, and a clock signal to generate control signals for controlling driving of the scan driver 120 and the data driver 130, and transmit the generated control signals to the scan driver 120 and the data driver 130.

The pixels PX1 and PX2 may emit light having a predetermined luminance by a driving current supplied to a light emitting element according to the data signals transmitted through the plurality of first data lines DL1a and DL1b and the plurality of second data lines DL2a and DL2b.

Hereinafter, for convenience, a display device including an organic light emitting diode ("OLED") as the light emitting element will be described. However, the inventive concepts are not limited thereto, and the inventive concepts may be applied to various types of display devices, such as a liquid crystal display ("LCD") device, an electrophoretic display ("EPD") device, a light emitting diode ("LED") display device, and the like.

Figure 2:
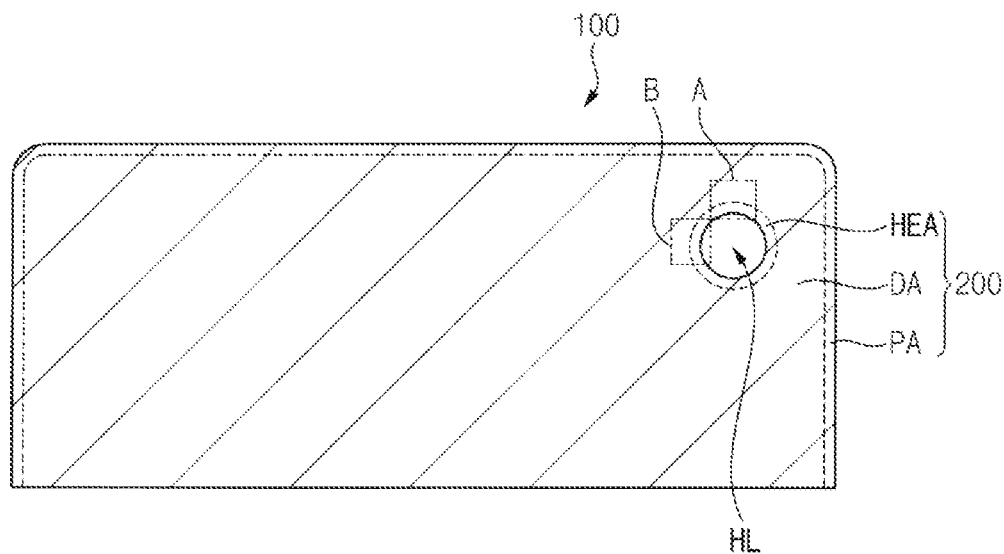
FIG. 2 is a plan view illustrating a part of a display device according to an embodiment.

FIG. 2 is a plan view illustrating a part of a display device according to an embodiment.

Referring to FIGS. 1 and 2, the display device 100 according to an embodiment may include a substrate 200 on which the pixels PX1 and PX2, the lines SL1, SL2, VL1, VL2, DL1a, DL1b, DL2a, and DL2b, the scan driver 120, the data driver 130, the power supply 140 and the timing controller 150 are disposed. The substrate 200 may include a display area DA, a peripheral area PA, and a hole edge area HEA.

The pixels PX1 and PX2 and lines SL1, SL2, VL1, VL2, DL1a, DL1b, DL2a, and DL2b may be disposed in the display area DA on the substrate 200. The display area DA may display an image through light emitted from each of the pixels PX1 and PX2.

The peripheral area PA may surround the display area DA. The peripheral area PA may form a bezel of the display device 100. The scan driver 120 may be disposed in the peripheral area PA on the substrate 200. The data driver 130, the power supply 140, and the timing controller 150 may be disposed in the peripheral area PA on the substrate 200, or may be disposed on a printed circuit board or flexible printed circuit electrically connected to the substrate 200. The peripheral area PA may be a non-display area.

A hole HL may be formed in the display area. The hole HL may penetrate through the substrate 200. A functional module may be disposed under the substrate 200 corresponding to the hole HL. The functional module may receive external light passing through the hole HL or may transmit a signal such as infrared rays or ultrasonic waves.

According to an embodiment, the functional module may include a camera module for capturing (or recognizing) an image of an object located in front of the display device, a face recognition sensor module for detecting a face of user, a pupil recognition sensor module for detecting a pupil of the user, an acceleration sensor module and a geomagnetic sensor module for determining a movement of the display device, a proximity sensor module and an infrared sensor module for detecting proximity with respect to the front surface of the display device, and an illuminance sensor module for measuring a degree of brightness of an outside.

The hole edge area HEA may surround the hole HL. The lines SL1, SL2, VL1, VL2, DL1a, DL1b, DL2a, and DL2b may be disposed in the hole edge area HEA on the substrate 200. The lines SL1, SL2, VL1, VL2, DL1a, DL1b, DL2a, and DL2b may bypass the hole HL along the hole edge area HEA. For example, the lines SL1, SL2, VL1, VL2, DL1a, DL1b, DL2a, and DL2b may be bent or curved along a shape of the hole edge area HEA without passing through the hole HL. The pixels PX1 and PX2 may not be disposed in the hole edge area HEA on the substrate 200. Accordingly, the hole edge area HEA may be a non-display area.

According to an embodiment, the hole HL may be formed in an upper portion of the display area DA. For example, the hole HL may be formed in a left or right upper portion of the display area DA. As described later, alternatively, the hole HL may be formed in a central upper portion of the display area DA.

According to an embodiment, the hole HL may have a circular shape on a plane, and the hole edge area HEA may have a circular annular shape on a plane. However, the inventive concepts are not limited thereto, and according to another embodiment, the hole HL may have a polygonal shape, an oval shape, and the like on a plane. Meanwhile, although one hole HL is formed in the display area DA in FIG. 2, the inventive concepts are not limited thereto, and a plurality of holes may be formed in the display area DA.

Figure 3:
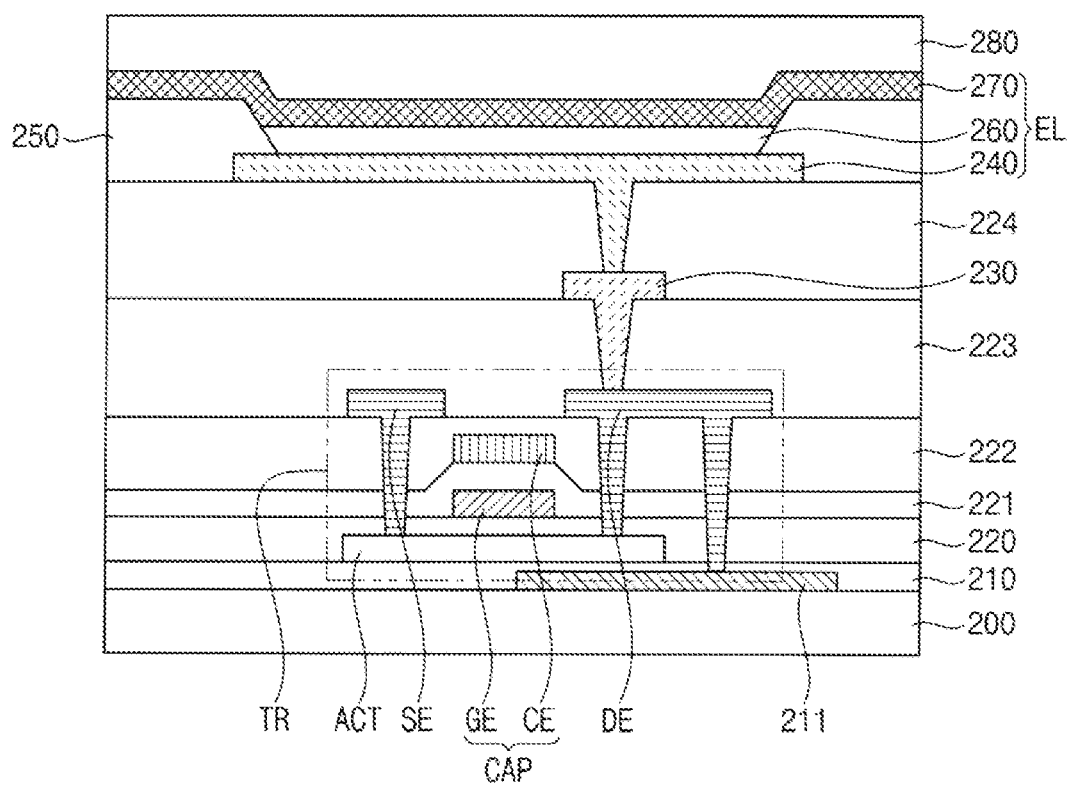
FIG. 3 is a cross-sectional view illustrating a display area of the display device of FIG. 2.

FIG. 3 is a cross-sectional view illustrating a display area of the display device of FIG. 2. For example, FIG. 3 may represent the first pixel PX1 or the second pixel PX2 of the display device 100 of FIG. 1.

Referring to FIG. 3, the display device 100 may include a transistor TR, a capacitor CAP, a light emitting element EL, and an encapsulation layer 280 disposed on a substrate 200. The transistor TR may include an active layer ACT, a gate electrode GE, a source electrode SE, and a drain electrode DE. The capacitor CAP may include the gate electrode GE and a capacitor electrode CE. The light emitting element EL may include a lower electrode 240, a light emitting layer 260, and an upper electrode 270.

The substrate 200 may be a transparent insulating substrate. For example, the substrate 200 may include glass, quartz, plastic, and the like.

A metal layer 211 may be disposed on the substrate 200. The metal layer 211 may serve to maintain a constant voltage characteristic of the active layer ACT of the thin film transistor TR. For example, the metal layer 211 may include a conductive material, such as titanium (Ti), molybdenum (Mo), copper (Cu), and the like.

A buffer layer 210 may be disposed on the substrate 200. The buffer layer 211 may sufficiently cover the metal layer 211. The buffer layer 210 may prevent diffusion of metal atoms or impurities from the substrate 200 to the transistor TR. For example, the buffer layer 210 may include an inorganic material, such as oxide or nitride.

The active layer ACT may be disposed on the buffer layer 210. For example, the active layer ACT may include amorphous silicon, polycrystalline silicon, oxide semiconductor, and the like. The active layer ACT may include a source region, a drain region, and a channel region positioned between the source region and the drain region. The source region and the drain region may be doped with P-type or N-type impurities, and the channel region may be doped with an impurity of a type different from that of the source region and drain region.

A first insulating layer 220 may be disposed on the active layer ACT. The first insulating layer 220 may sufficiently cover the active layer ACT. For example, the first insulating layer 220 may include an inorganic insulating material such as silicon oxide ($SiO_x$), silicon nitride ($SiN_x$), silicon nitride ($SiN_x$), silicon oxynitride ($SiO_xN_y$), silicon carbide ($SiC_x$), and the like.

The gate electrode GE may be disposed on the first insulating layer 220. The gate electrode GE may overlap the channel region of the active layer ACT.

The gate electrode GE may be disposed on the first insulating layer 220. The gate electrode GE may overlap the channel region of the active layer ACT. The gate electrode GE may include a conductive material, such as a metal, an alloy of metal, and the like. For example, the gate electrode GE may include molybdenum (Mo), copper (Cu), and the like.

A second insulating layer 221 may be disposed on the gate electrode GE. The second insulating layer 221 may sufficiently cover the gate electrode GE and may be disposed on the first insulating layer 220. For example, the second insulating layer 221 may include an inorganic insulating material such as silicon oxide, silicon nitride, silicon oxynitride, silicon carbide, and the like.

The capacitor electrode CE may be disposed on the second insulating layer 221. The capacitor electrode CE may overlap the gate electrode GE. The capacitor electrode CE may include a conductive material, such as a metal, an alloy of metal, and the like. For example, the capacitor electrode CE may include molybdenum (Mo), copper (Cu), and the like.

A third insulating layer 222 may be disposed on the capacitor electrode CE. The third insulating layer 222 may sufficiently cover the capacitor electrode CE and may be disposed on the second insulating layer 221. For example, the third insulating layer 222 may include an inorganic insulating material, such as silicon oxide, silicon nitride, silicon oxynitride, silicon carbide, and the like.

The source electrode SE and the drain electrode DE may be disposed on the third insulating layer 222. The source electrode SE may be electrically connected to the source region of the active layer ACT. The drain electrode DE may be electrically connected to the drain region of the active layer ACT. In addition, the drain electrode DE may be electrically connected to the metal layer 211. Each of the source electrode SE and the drain electrode DE may include a conductive material, such as a metal, an alloy of a metal, and the like. For example, each of the source electrode SE and the drain electrode DE may include aluminum (Al), titanium (Ti), copper (Cu), and the like.

A fourth insulating layer 223 may be disposed on the source electrode SE and the drain electrode DE. The fourth insulating layer 223 may cover the source electrode SE and the drain electrode DE and may be disposed on the third insulating layer 222. The fourth insulating layer 223 may protect the transistor TR and may provide a flat surface on the transistor TR. Accordingly, the fourth insulating layer 223 may have a relatively large thickness. For example, the fourth insulating layer 223 may include an organic insulating material, such as polyimide (PI), and the like.

A connection electrode 230 may be disposed on the fourth insulating layer 223. The connection electrode 230 may be electrically connected to the source electrode SE or the drain electrode DE. The connection electrode 230 may include a conductive material, such as a metal, an alloy of metal, and the like. For example, the connection electrode 230 may include aluminum (Al), titanium (Ti), copper (Cu), and the like.

A fifth insulating layer 224 may be disposed on the connection electrode 230. The fifth insulating layer 224 may sufficiently cover the connection electrode 230 and may be disposed on the fourth insulating layer 223. For example, the fifth insulating layer 224 may include an organic insulating material such as polyimide (PI), and the like.

The lower electrode 240 may be disposed on the fifth insulating layer 224. The lower electrode 240 may be electrically connected to connection electrode 230. For example, the lower electrode 240 may include a conductive material, such as a metal, a transparent conductive oxide, and the like.

A pixel defining layer 250 may be disposed on the lower electrode 240 and the fifth insulating layer 224. The pixel defining layer 250 may include an opening exposing a central portion of the lower electrode 240. For example, the pixel defining layer 250 may include an organic insulating material, such as polyimide (PI), and the like.

The light emitting layer 260 may be disposed on the lower electrode 240. That is, the light emitting layer 260 may be disposed on the lower electrode 240 exposed by the opening. The light emitting layer 260 may be formed using at least one of light emitting materials capable of emitting red light, green light, and blue light.

For example, the light emitting layer 260 may include a low molecular weight organic compound or a high molecular weight organic compound. For example, the low molecular weight organic compound may include copper phthalocyanine, N, N'-diphenylbenzidine, tris-(8-hydroxyquinoline)aluminum, and the like, and the high molecular weight organic compound may include poly(3,4-ethylenedioxythiophene), polyaniline, poly-phenylenevinylene, polyfluorene, and the like.

The upper electrode 270 may be disposed on the light emitting layer 260 and the pixel defining layer PDL. The upper electrode 270 may face the lower electrode 240 with the light emitting layer 260 interposed therebetween. The upper electrode 270 may include a conductive material, such as a metal, a transparent conductive oxide, and the like. Since the lower electrode 240 is electrically connected to the connection electrode 230, the light emitting element EL may be electrically connected to the connection electrode 230.

An encapsulation layer 280 may be disposed on the upper electrode 270. The encapsulation layer 280 may include at least one inorganic layer and at least one organic layer. The encapsulation layer 280 is disposed on the light emitting element EL to block impurities from outside from flowing into the light emitting element EL, and protect the light emitting element EL from external impact.

For example, the organic layer may include a cured polymer, such as polyacrylate (PAR), and the like. For example, the inorganic layer may include silicon oxide ($SiO_x$), silicon nitride ($SiN_x$), silicon carbide ($SiC_x$), aluminum oxide ($AlO_x$), tantalum oxide ($TaO_x$), hafnium oxide ($HfO_x$), zirconium oxide ($ZrO_x$), titanium oxide ($TiO_x$), and the like.

Figure 4:
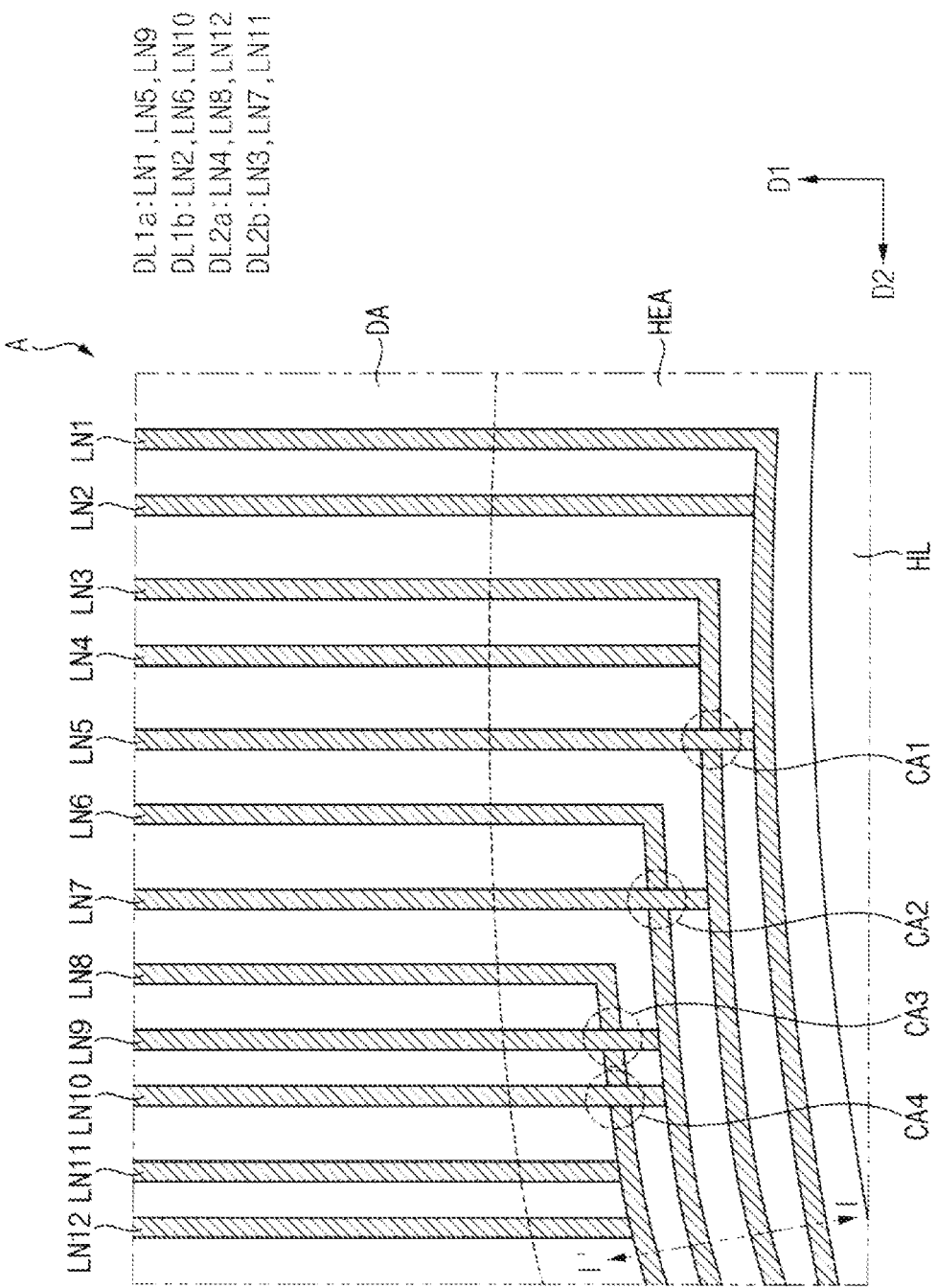
FIG. 4 is a plan view illustrating an enlarged view of area "A" of FIG. 2.
Figure 5:
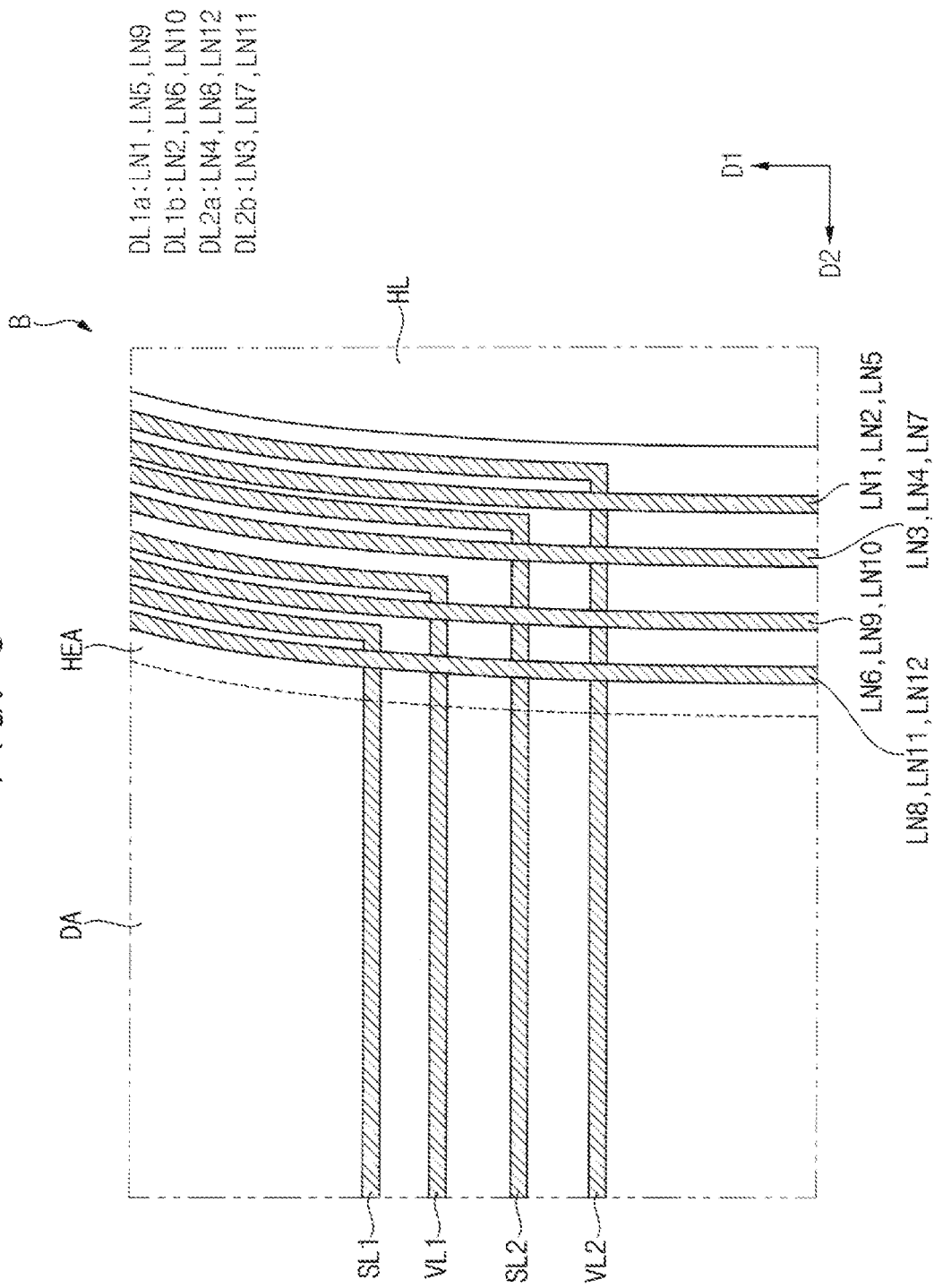
FIG. 5 is a plan view illustrating an enlarged view of area "B" of FIG. 2.

FIG. 4 is a plan view illustrating an enlarged view of area "A" of FIG. 2. FIG. 5 is a plan view illustrating an enlarged view of area "B" of FIG. 2. FIGS. 4 and 5 may represent the scan lines SL1 and SL2, the initialization voltage lines VL1 and VL2, the first data lines DL1a and DL1b, and the second data lines DL2a and DL2b of the display device 100 of FIG. 1. For example, FIG. 4 may represent an upper side of the hole HL of the display device 100 of FIG. 2, and FIG. 5 may represent a left side of the hole HL of the display device 100 of FIG. 2.

Referring to FIGS. 1, 2, 4, and 5, the scan lines SL1 and SL2, the initialization voltage lines VL1 and VL2, the first data lines DL1a and DL1b, and the second data lines DL2a AND DL2 may be disposed in the display area DA and the hole edge area HEA on the substrate 200. The first data lines DL1a and DL1b may include the (1-1)-th data lines DL1a connected to one side of each of the first pixels PX1 and the (1-2)-th data lines DL1b connected to another side of each of the first pixels PX1. The second data lines DL2a and DL2b may include the 2-1 data lines DL2a connected to one side of each of the second pixels PX2 and the 2-2 data lines DL2b connected to another side of each of the second pixels PX2.

The first data lines DL1a and DL1b may extend in a first direction D1 in the display area DA and may be arranged in a second direction D2 orthogonal to the first direction D1. The first data lines DL1a and DL1b may bypass the hole HL along the hole edge area HEA.

The second data lines DL2a and DL2b may extend in the first direction D1 in the display area DA and may be arranged adjacent to the first data lines DL1a and DL1b. The second data lines DL2a and DL2b may bypass the hole HL along the hole edge area HEA.

The scan lines SL1 and SL2 may extend in the second direction D2 in the display area DA and may be arranged in a first direction D1 orthogonal to the second direction D2. The scan lines SL1 and SL2 may include the first scan line SL1 and the second scan line SL2. According to an embodiment, the scan lines SL1 and SL2 may bypass the hole HL along the hole edge area HEA.

In the hole edge area HEA, at least one of the scan lines SL1 and SL2 may overlap the first data lines DL1a and DL1b and the second data lines DL2a and DL2b on a plane. Alternatively, in the hole edge area HEA, at least one of the scan lines SL1 and SL2 may be non-overlapping with the first data lines DL1a and DL1b and the second data lines DL2a and DL2b on a plane.

In the conventional display device, initialization voltage lines do not bypass a hole along a hole edge area. Accordingly, a difference in luminance occurs due to a difference in voltage drop between the hole edge area and a display area excluding the hole edge area.

The initialization voltage lines VL1 and VL2 may extend in the second direction D2 in the display area DA and may be alternately arranged with the scan lines SL1 and SL2 in the first direction D1. The initialization voltage lines VL1 and VL2 may include the first initialization voltage line VL1 and the second initialization voltage line VL2. According to an embodiment, the initialization voltage lines VL1 and VL2 may bypass the hole HL along the hole edge area HEA. Accordingly, a difference in luminance due to a difference in voltage drop between the display area DA and the hole edge area HEA may be compensated.

In the hole edge area HEA, at least one of the initialization voltage lines VL1 and VL2 may overlap the first data lines DL1a and DL1b and the second data lines DL2a and DL2b on a plane. Alternatively, in the hole edge area HEA, at least one of the initialization voltage lines VL1 and VL2 may be non-overlapping with the first data lines DL1a and DL1b and the second data lines DL2a and DL2b on a plane.

According to an embodiment, the (1-1)-th data lines DL1a may include a first line LN1, a fifth line LN5, and a ninth line LN9 and the (1-2)-th data lines DL1b may include a second line LN2, a sixth line LN6, and a tenth line LN10. In addition, the (2-1)-th data lines DL2a may include a fourth line LN4, an eighth line LN8, and a twelfth line LN12, and the (2-2)-th data lines DL2b may include a third line LN3, a seventh line LN7, and an eleventh line LN11.

The second line LN2 may be located in the second direction D2 from the first line LN1, and the third line LN3 may be located in the second direction D2 from the second line LN2. The fourth line LN4 may be located in the second direction D2 from the third line LN3 and the fifth line LN5 may be located in the second direction D2 from the fourth line LN4. The sixth line LN6 may be located in the second direction D2 from the fifth line LN5 and the seventh line LN7 may be located in the second direction D2 from the sixth line LN6. The eighth lined LN8 may be located in the second direction D2 from the seventh line LN7 and the ninth line LN9 may be located in the second direction D2 from the eighth line LN8. The tenth line LN10 may be located in the second direction D2 from the ninth line LN9, the eleventh line LN11 may be located in the second direction D2 from the tenth line LN10, and the twelfth line LN12 may be located in the second direction D2 from the eleventh line LN11. That is, in the display area DA, the first to twelfth lines LN1, LN2, LN3, LN4, LN5, LN6, LN7, LN8, LN9, LN10, and LN11 may be sequentially arranged in the second direction D2. In other words, in the display area DA, the first to twelfth lines LN1, LN2, LN3, LN4, LN5, LN6, LN7, LN8, LN9, LN10, and LN11 may be repeatedly arranged in the order of the first to twelfth lines LN1, LN2, LN3, LN4, LN5, LN6, LN7, LN8, LN9, LN10, and LN11 along the second direction D2.

According to an embodiment, in the hole edge area HEA, the first data lines DL1a and DL1b may be aggregated with each other, and the second data lines DL2a and DL2b may be aggregated with each other. That is, in the hole edge area HEA, the first data lines DL1a and DL1b may be gathered with each other, and the second data lines DL2a and DL2b may be gathered with each other. For example, in the hole edge area HEA, the first line LN1, the second line LN2, and the fifth line LN5 may be aggregated with each other. In the hole edge area HEA, the third line LN3, the fourth line LN4, and the seventh line LN7 may be aggregated with each other. In the hole edge area HEA, the sixth line LN6, the ninth line LN9, and the tenth line LN10 may be aggregated with each other. In the hole edge area HEA, the eighth line LN8, the eleventh line LN11, and the twelfth line LN12 may be aggregated with each other.

According to an embodiment, at least one of the first data lines DL1a and DL1b and at least one of the second data lines DL2a and DL2b may cross in the hole edge area HEA. For example, in a first cross area CA1, the fifth line LN5 among the first data DL1a and DL1b may cross the third line LN3 and the fourth line LN4 among the second data lines DL2a and DL2b. In a second cross area CA2, the seventh line LN7 among the first data lines DL1a and DL1b may cross the sixth line LN6 among the second data lines DL2a and DL2b. In addition, in a third cross area CA3, the ninth line LN9 among the first data lines DL1a and DL1b may cross the eighth line LN8 among the second data lines DL2a and DL2b. In a fourth cross area CA4, the tenth line LN10 among the first data lines DL1a and DL1b may cross the eighth line LN8 among the second data lines DL2a and DL2b.

According to an embodiment, in the hole edge area HEA, each of the first data lines DL1a and DL1b and the second data lines DL2a and DL2b may be disposed on three layers different from each other. For example, in the hole edge area HEA, the first line LN1, the second line LN2, and the fifth line LN5 among the first data lines DL1a and DL1b may be disposed on three layers different from each other. In the hole edge area HEA, the third line LN3, the fourth line LN4, and the seventh line LN7 among the second data lines DL2a and DL2b may be disposed on three layers different from each other.

When a distance between the first data lines DL1a and DL1b and the second data lines DL2a and DL2b decreases, coupling between the first data lines DL1a and DL1b and the second data lines DL2a and DL2b may occur. When coupling occurs between the first data lines DL1a and DL1b and the second data lines DL2a and DL2b, a data signal transmitted by the second data lines DL2a and DL2b may be distorted by a voltage change of a data signal transmitted by the first data lines DL1a and DL1b or a data signal transmitted by the first data lines DL1a and DL1b may be distorted by a voltage change of a data signal transmitted by the second data lines DL2a and DL2b.

According to an embodiment, in the hole edge area HEA, the first data lines DL1a and DL1b may overlap with each other on a plane, and the second data lines DL2a and DL2b may overlap with each other on a plane.

For example, in the hole edge area HEA, the first line LN1, the second line LN2, and the fifth line LN5 may overlap with each other on a plane. In the hole edge area HEA, the third line LN3, the fourth line LN4, and the seventh line LN7 may overlap with each other on a plane. In the hole edge area HEA, the sixth line LN6, the ninth line LN9, and the tenth line LN10 may overlap with each other on a plane. In the hole edge area HEA, the eighth line LN8, the eleventh line LN11 and the twelfth line LN12 may overlap with each other on a plane. In the hole edge area HEA, as the first data lines DL1a and DL1b overlap with each other on a plane and the second data lines DL2a and DL2b overlap with each other on a plane, coupling between the first data lines DL1a and DL1b and the second data lines DL2a and DL2b may be reduced or substantially prevented. In addition, in the hole edge area HEA, an area occupied by the first data lines DL1a and DL1b and the second lines DL2a and DL2b may be reduced. Accordingly, a dead space of the display device 100 may be reduced.

In a conventional display device, in a hole edge area, as each of first data lines and second data lines are disposed on two layers different from each other, an area occupied by the first data lines and the second data lines increases. As a result, a dead space of the display device increases.

In the display device 100 according to an embodiment, in the hole edge area HEA, as each of the first data lines DL1a and DL1b and the second data lines DL2a and DL2b are disposed on three layers different from each other, an area occupied by the first data lines DL1a and DL1b and the second data lines DL2a and DL2b may be reduced. Accordingly, a dead space of the display device 100 may be reduced.

Figure 6:
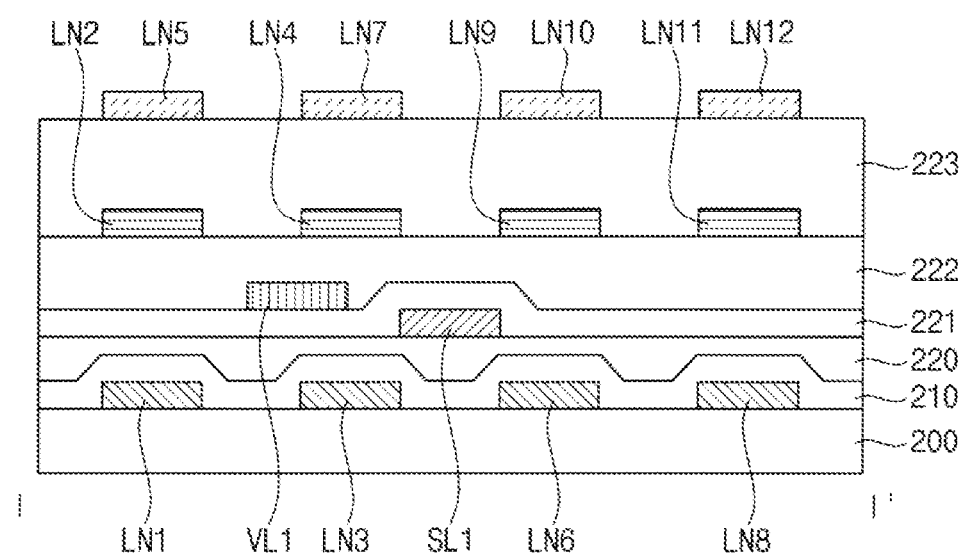
FIG. 6 is a cross-sectional view taken along line I-I' of FIG. 4.

FIG. 6 is a cross-sectional view taken along line I-I' of FIG. 4.

Referring to FIGS. 2, 3, 5, and 6, the first scan lines SL1, the first initialization voltage lines VL1, the first data lines DL1a and DL1b, and the second data lines DL2a and DL2b bypassing the hole HL may be disposed in the hole edge area HEA on the substrate 200.

In the hole edge area HEA, each of the first data lines DL1a and DL1b and the second data lines DL2a and DL2b may be disposed on the same layer as at least one of the metal layer 211, the source electrode SE, the drain electrode DE, and the connection electrode CE disposed in the display area DA. According to an embodiment, in the hole edge area HEA, the first line LN1, the third line LN3, the sixth line LN6, and the eighth line LN8 may be disposed on the same layer as the metal layer 211 disposed in the display area DA. In the hole edge area HEA, the second line LN2, the fourth line LN4, the ninth line LN9, and the eleventh lined LN11 may disposed on the same layer as the source electrode SE and the drain electrode DE disposed in the display area DA. In the hole edge area HEA, the fifth line LN5, the seventh line LN7, the tenth line LN10, and the twelfth line LN12 may be disposed on the same layer as the connection electrode 230 disposed in the display area DA. That is, in the hole edge area HA, the first line LN1, the third line LN3, the sixth line LN6, and the eighth line LN8 may be disposed on the substrate 200, the second line LN2, the fourth line LN4, the ninth line LN9, and the eleventh lined LN11 may be disposed on the third insulating layer 222, and the fifth line LN5, the seventh line LN7, the tenth line LN10, and the twelfth line LN12 may be disposed on the fourth insulating layer 223.

According to an embodiment, in the hole edge area HEA, the first scan lines SL1 may be disposed on the same layer as the gate electrode GE disposed in the display area DA, and the first initialization voltage lines VL1 may be disposed on the same layer as the capacitor electrode CE disposed in the display area DA. That is, in the hole edge area HEA, the first scan lines SL1 may be disposed on the first insulating layer 220, and the first initialization voltage lines VL1 may be disposed on the second insulating layer 221. Similarly, the second scan lines SL2 may be disposed on the same layer as the first scan lines SL1, and the second initialization voltage lines VL2 may be disposed on the same layer as the first initialization voltage lines VL1.

Figure 7:
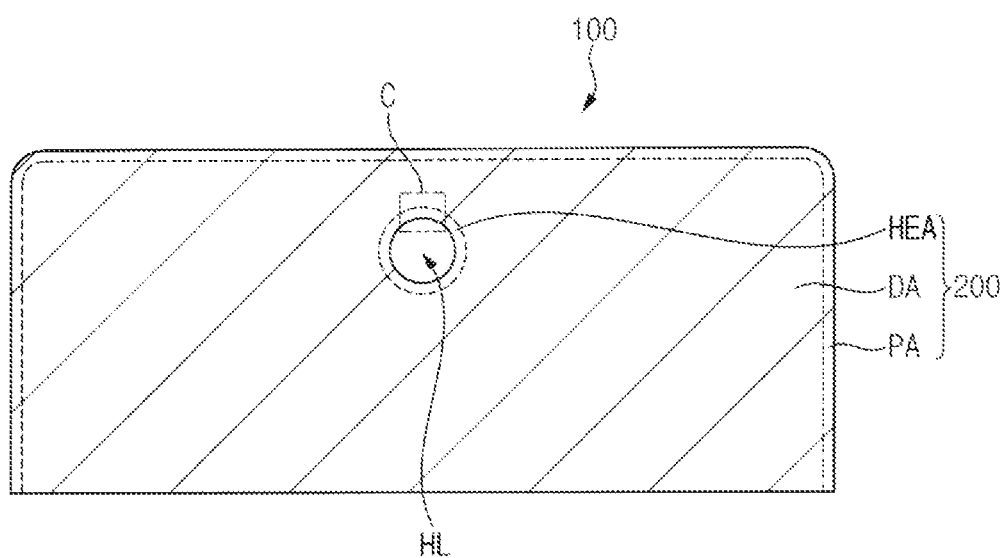
FIG. 7 is a plan view illustrating a part of a display device according to an embodiment.

FIG. 7 is a plan view illustrating a part of a display device according to an embodiment.

Referring to FIGS. 1 and 7, the substrate 200 of the display device 100 according to an embodiment may include the display area DA, the peripheral area PA, and the hole edge area HEA. However, the display device 100 described with reference to FIG. 7 may be substantially the same as or similar to the display device 100 described with reference to FIG. 2 except for a location of the hole HL. Hereinafter, duplicate descriptions are omitted.

According to an embodiment, the hole HL may be formed in an upper portion of the display area DA. For example, the hole HL may be formed in a central upper portion of the display area DA.

According to an embodiment, the scan lines SL1 and SL2 and the initialization voltage lines VL1 and VL2 may not be disposed in the hole edge area HEA on the substrate 200. That is, the first data lines DL1a and DL1b and the second data lines DL2a and DL2b are disposed in the hole edge area HEA on the substrate 200, but the scan lines SL1 and SL2 and the initialization voltage lines VL1 and VL2 may not be disposed in the hole edge area HEA on the substrate 200. In other words, the scan lines SL1 and SL2 and the initialization voltage lines VL1 and VL2 may not bypass the hole HL along the hole edge area HEA.

Hereinafter, the display device 100 according to an embodiment will be described with reference to FIGS. 8 and 9. In the display device 100 according to a embodiment described with reference to FIGS. 8 and 9, descriptions of components that area substantially the same as or similar to the display device 100 according to an embodiment described with reference to FIGS. 4, 5, and 6 will be emitted.

Figure 8:
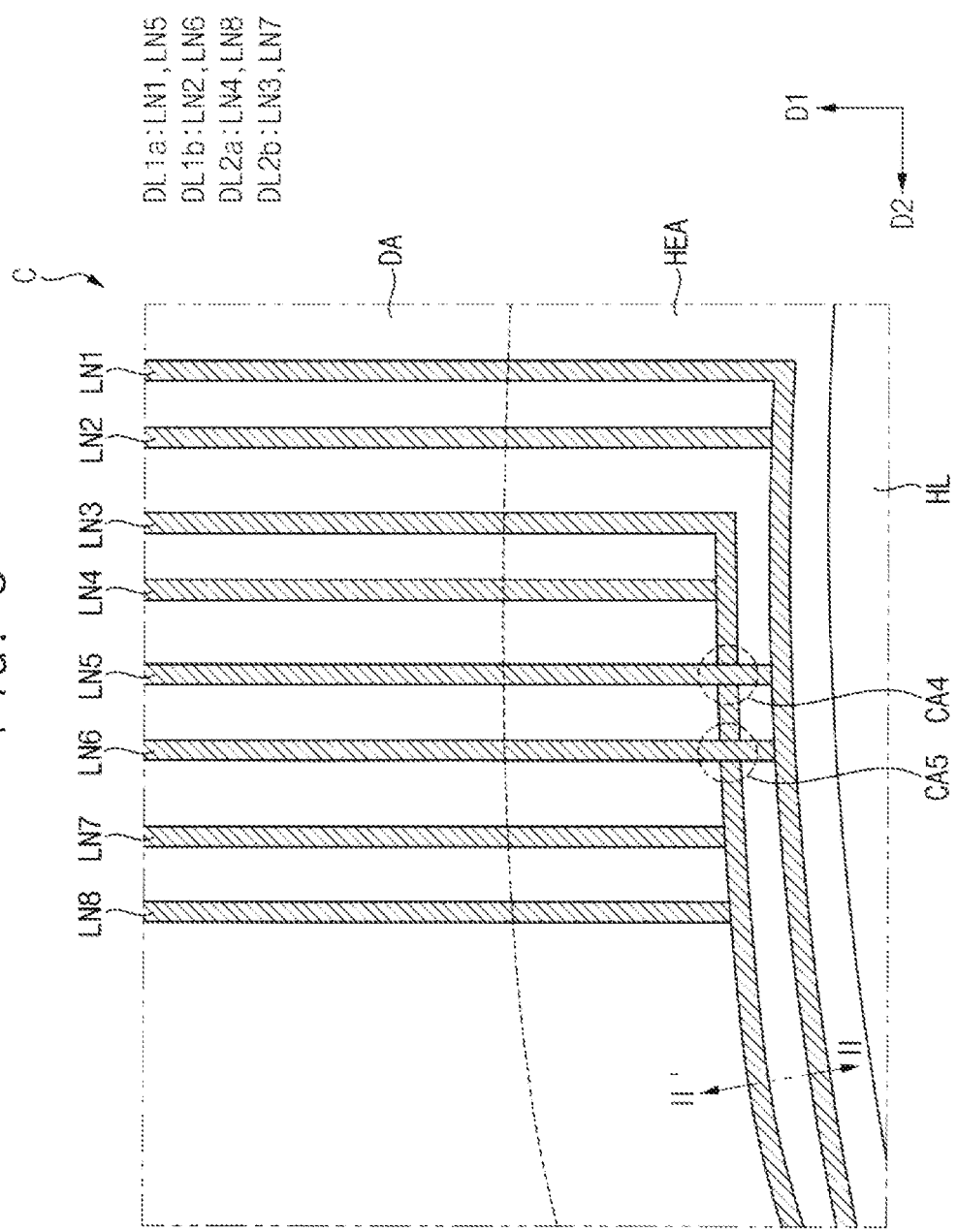
FIG. 8 is a plan view illustrating an enlarged view of area "C" of FIG. 7.

FIG. 8 is a plan view illustrating an enlarged view of area "C" of FIG. 7. For example, FIG. 8 illustrates the first data lines DL1a and DL1b and the second data lines DL2a and DL2b of the display device 100 of FIG. 7.

Referring to FIGS. 1, 7, and 8, the first data lines DL1a and DL1b and the second data lines DL2a and DL2b may be disposed in the display area DA and the hole edge area HEA on the substrate 200.

The first data lines DL1a and DL1b may extend in the first direction D1 in the display area DA and may be arranged in the second direction D2 orthogonal to the first direction D1. The first data lines DL1a and DL2b may bypass the hole HL along the hole edge area HEA.

The second data lines DL2a and DL2b may extend in the first direction D1 in the display area D1 and may be arranged adjacent to the first data lines DL1a and DL1b. The second data lines DL2a and DL2b may bypass the hole HL along the hole edge area HEA.

According to an embodiment, the (1-1)-th data lines DL1a may include a first line LN1 and a fifth line LN5. The (1-2)-th data lines DL1b may include a second line LN6 and a sixth line LN6. In addition, the (2-1)-th data lines DL2a may include a fourth line LN4 and an eighth line LN8. The (2-2)-th data lines DL2b may include a third line LN3 and a seventh line LN7.

The second line LN2 may be located in the second direction D2 from the first line LN1 and the third line LN3 may be located in the second direction D2 from the second line LN2. The fourth line LN4 may be located in the second direction D2 from the third line LN3 and the fifth line LN5 may be located in the second direction D2 from the fourth line LN4. The sixth line LN6 may be located in the second direction D2 from the fifth line LN5, the seventh line LN7 may be located in the second direction D2 from the sixth line LN6, and the eighth line LN8 may be located in the second direction D2 from the seventh line LN7. That is, in the display area DA, the first to eighth lines LN1, LN2, LN3, LN4, LN5, LN6, LN7, and LN8 may be sequentially arranged in the second direction D2. In other words, in the display area DA, the first to eighth lines LN1, LN2, LN3, LN4, LN5, LN6, LN7, and LN8 may be repeatedly arranged in the order of the first to eighth lines LN1, LN2, LN3, LN4, LN5, LN6, LN7, and LN8 along the second direction D2.

According to an embodiment, at least one of the first data lines DL1a and DL1b and at least one of the second data lines DL2a and DL2b may cross in the hole edge area HEA. For example, in a fourth cross area CA4, the fifth line LN5 of the first data lines DL1a and DL1b may cross the third line LN3 of the second data lines DL2a and DL2b. In a fifth cross area CA5, the sixth line LN6 of the first data lines DL1a and DL1b may cross the third line LN3 of the second data lines DL2a and DL2b.

According to an embodiment, in the hole edge area HEA, each of the first data lines DL1a and DL1b and the second data lines DL2a and DL2b may be disposed on four layers different from each other. For example, in the hole edge area HEA, the first line LN1, the second line LN2, the fifth line LN5, and the sixth line LN6 among the first data lines DL1a and DL1b may be disposed on four layers different from each other and the third line LN3, the fourth line LN4, the seventh line LN7, and the eighth line LN8 among the second data lines DL2a and DL2b may be disposed on four layers different from each other. That is, each of the scan lines SL1 and SL2 and the initialization voltage lines VL1 and VL2 disposed in the hole edge area HEA on the substrate 200 may be used as the second line LN2 and the fourth line LN4. In the hole edge area HEA, as each of the first data lines DL1a and DL1b and the second data lines DL2a and DL2b may disposed on four layers different from each other, an area occupied by the first data lines DL1a and DL1b and the second data lines DL2a and DL2b may be further reduced in the hole edge area HEA. Accordingly, a dead space of the display device 100 may be further reduced.

According to an embodiment, in the hole edge area HEA, the first data lines DL1a and DL1b may overlap with each other on a plane, and the second data lines DL2a and DL2b may overlap with each other on a plane. For example, in the hole edge area HEA, the first line LN1, the second line LN2, the fifth line LN5, and the sixth line LN6 may overlap with each other on a plane and the third line LN3, the fourth line LN4, the seventh line LN7, and the eighth line LN8 may overlap with each other on a plane.

In the hole edge area HEA, as the first data lines DL1a and DL1b overlap with each other on a plane and the second data lines DL2a and DL2b overlap with each other on a plane, coupling between the first data lines DL1a and DL1b and the second data lines DL2a and DL2b may be reduced or substantially prevented. In addition, an area occupied by the first data lines DL1a and DL1b the second data lines DL2a and DL2b in the hole edge area HEA may be reduced. Accordingly, a dead space of the display device 100 may be reduced.

Figure 9:
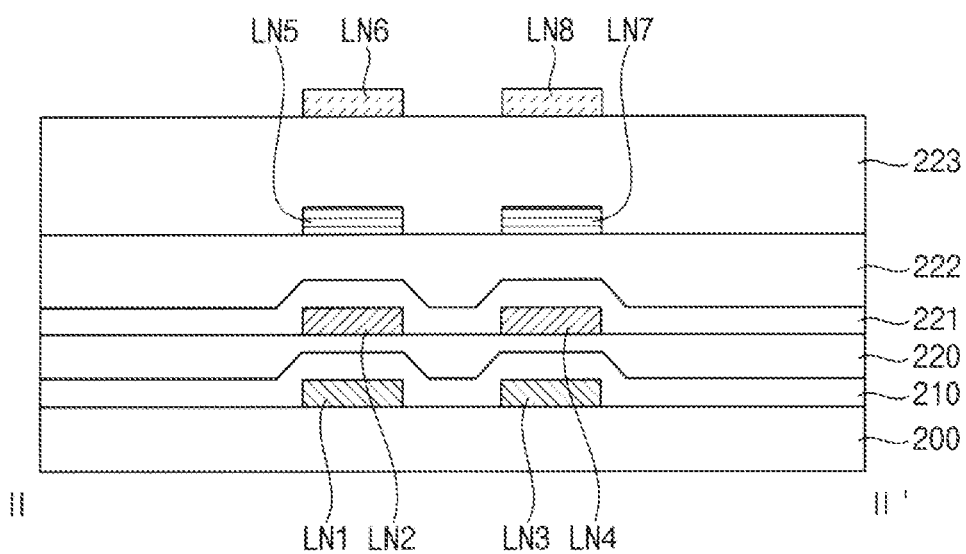
FIG. 9 is a cross-sectional view taken along line II-II' of FIG. 8.

FIG. 9 is a cross-sectional view taken along line II-II' of FIG. 8.

Referring to FIGS. 3, 7, 8, and 9, the first data lines DL1a and DL1b and the second data lines DL2a bypassing the hole HL may be disposed in the hole edge area HEA on the substrate 200.

In the hole edge area HEA, each of the first data lines DL1a and DL1b and the second data lines DL2a and DL2b may be disposed on the same layer as at least one of the metal layer 211, the gate electrode GE, the source electrode SE, the drain electrode DE, and the connection electrode CE disposed in the display area DA.

According to an embodiment, in the hole edge area HEA, the first line LN1 and the third line LN3 may be disposed on the same layer as the metal layer 211 disposed in the display area DA. In the hole edge area HEA, the second line LN2 and the fourth line LN4 may be disposed on the same layer as the gate electrode GE disposed in the display area DA. In the hole edge area HEA, the fifth line LN5 and the seventh line LN7 may be disposed on the same layer as the source electrode SE and the drain electrode DE disposed in the display area DA. In the hole edge area HEA, the sixth line LN6 and the eighth line LN8 may be disposed on the same layer as the connection electrode 230 disposed in the display area DA. That is, in the hole edge area HEA, the first line LN1 and the third line LN3 may be disposed on the substrate 200, the second line LN2 and the fourth line LN4 may be disposed on the first insulating layer 220, the fifth line LN5 and the seventh line LN7 may be disposed on the third insulating layer 222, and the sixth line LN6 and the eighth line LN8 may be disposed on the fourth insulating layer 223.

Figure 10:
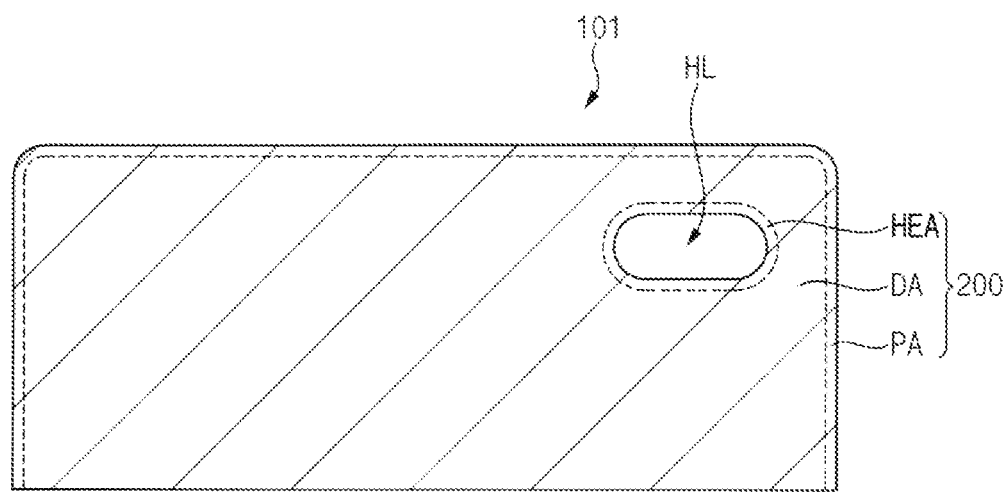
FIG. 10 is a plan view illustrating a part of a display device according to an embodiment.

FIG. 10 is a plan view illustrating a part of a display device according to an embodiment.

Referring to FIG. 10, the substrate 200 of the display device 101 according to an embodiment may include the display area DA, the peripheral area PA, and the hole edge area HEA. However, the display device 101 described with reference to FIG. 10 may be substantially the same as, or similar to, the display device 100 described with reference to FIG. 2 except for the shape of the hole HL. Hereinafter, duplicate descriptions are omitted.

According to an embodiment, the hole HL may have a rectangular shape with rounded corners on a plane, and the hole edge area HEA may have a rectangular ring shape with rounded corners on a plane.

Figure 11:
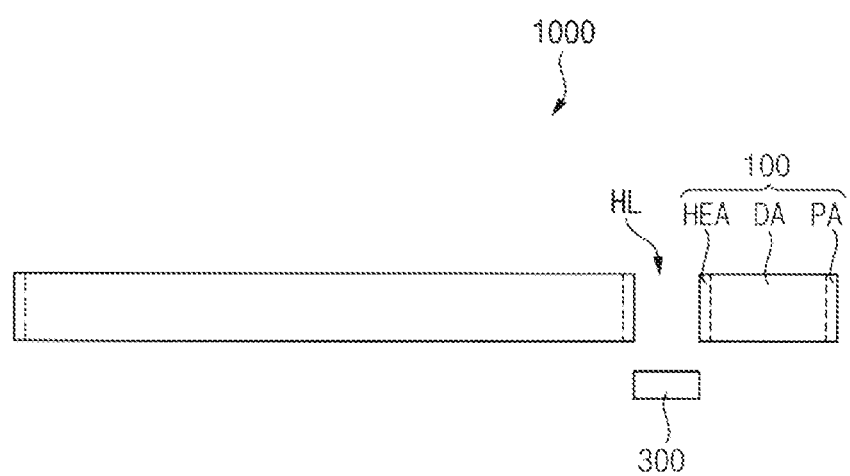
FIG. 11 is a cross-sectional view illustrating an electronic device according to an embodiment.

FIG. 11 is a cross-sectional view illustrating an electronic device according to an embodiment.

Referring to FIG. 11, an electronic device 1000 according to an embodiment may include the display device 100 and a functional module 300. The display device 100 may include the display area DA, the peripheral area PA, and the hole edge area HEA. The display device 100 of FIG. 11 may be substantially the same as the display device 100 described with reference to FIGS. 1, 2, 3, 4, 5, 6, 7, 8, and 9. Alternatively, the display device 100 of FIG. 11 may be substantially the same as the display device 101 described with reference to FIG. 10.

The functional module 300 may be disposed under the display device 100. The functional module 300 may be disposed under the display device 100 to overlap the hole HL.

According to an embodiment, the functional module 300 may include a camera module for capturing (or recognizing) an image of an object located in front of the display device 100; a face recognition sensor module for detecting a face of user; a pupil recognition sensor module for detecting a pupil of the user; an acceleration sensor module and a geomagnetic sensor module for determining a movement of the display device; a proximity sensor module and an infrared sensor module for detecting proximity with respect to the front surface of the display device; and an illuminance sensor module for measuring a degree of brightness from the outside.

The display device according to embodiments of the present invention may be applied to a display device included in a computer, a notebook computer, a mobile phone, a smart phone, a smart pad, a PMP, a PDA, an MP3 player, and the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate including a display area, in which a hole is formed, and a hole edge area surrounding the hole;
    a plurality of first data lines disposed on the substrate, extending in a first direction in the display area, arranged in a second direction orthogonal to the first direction, bypassing the hole along the hole edge area, and including a plurality of (1-1)th data lines and a plurality of (1-2)th data lines; and
    a plurality of second data lines disposed on the substrate, extending in the first direction in the display area, arranged adjacent to the plurality of first data lines, bypassing the hole along hole edge area, and including a plurality of (2-1)th data lines and a plurality of (2-2)th data lines,
    wherein, in the hole edge area:
        each of the plurality of first data lines and the plurality of second data lines are disposed on three layers different from each other,
        each of the plurality of (1-1)th data lines is connected to one side of each of a plurality of first pixels arranged in a first row of the display area,
        each of the plurality of (1-2)th data lines is connected to another side of each of the plurality of first pixels arranged in the first row of the display area,
        each of the plurality of (2-1)th data lines is connected to one side of each of a plurality of second pixels arranged in a second row located in the first direction from the first row of the display area,
        each of the plurality of (2-2)th data lines is connected to another side of each of the plurality of second pixels arranged in the second row located in the first direction from the first row of the display area,
        at least three of the plurality of first data lines overlap one another in a third direction orthogonal to both the first direction and the second direction,
        one of the at least three of the plurality of first data lines is disposed between two of the at least three of the plurality of first data lines, a number of layers between the one of the at least three of the plurality of first data lines and a first one of the two of the at least three of the plurality of first data lines is different from a number of layers between the one of the at least three of the plurality of first data lines and a second one of the two of the at least three of the plurality of first data lines,
        at least three of the plurality of second data lines overlap one another in the third direction, and
        one of the at least three of the plurality of second data lines is disposed between two of the at least three of the plurality of second data lines, a number of layers between the one of the at least three of the plurality of second data lines and a first one of the two of the at least three of the plurality of second data lines is different from a number of layers between the one of the at least three of the plurality of second data lines and a second one of the two of the at least three of the plurality of second data lines.

2. The display device of claim 1, wherein, in the hole edge area:
    at least two of the (n−1)th data lines overlap at least one of the (n−2)th data lines in the third direction $\forall n = \in \{1, 2\}$, and
    at least two of the (m−2)th data lines overlap at least one of the (m−1)th data lines in the third direction $\forall n = \in \{1, 2\}$.

3. The display device of claim 1, wherein, in the hole edge area:
    the at least three of the plurality of first data lines follow a same first path about at least a portion of the hole,
    the at least three of the plurality of second data lines follow a same second path about at least the portion of the hole, and
    the first path is spaced apart from the second path when viewed in the third direction.

4. The display device of claim 1, wherein, in the hole edge area, at least one of the plurality of first data lines crosses at least one of the plurality of second data lines such that the at least one of the plurality of first data lines overlaps, in the third direction, the at least one of the plurality of second data lines.

5. The display device of claim 1, wherein the hole has a circular shape, and the hole edge area has a circular annular shape.

6. The display device of claim 1, wherein each of the plurality of first data lines and the plurality of second data lines includes:
    a first line disposed on the substrate;
    a second line disposed on the first line; and
    a third line disposed on the second line.

7. The display device of claim 6, wherein the first line, the second line, and the third line extend in the first direction, and are repeatedly arranged in an order of the first line, the second line, and the third line along the second direction.

8. The display device of claim 6, further comprising:
    a metal layer disposed in the display area on the substrate;
    an active layer disposed on the metal layer;
    a gate electrode disposed on the active layer;

a capacitor electrode disposed on the gate electrode;
a drain electrode disposed on the capacitor electrode and connected to the active layer; and
a connection electrode disposed on the drain electrode and connected to the drain electrode.

9. The display device of claim 8, wherein, in the hole edge area, the first line is disposed on a same layer as the metal layer, the second line is disposed on a same layer as the drain electrode, and the third line is disposed on a same layer as the connection electrode.

10. The display device of claim 8, further comprising an initialization voltage line disposed on the substrate, extending in the second direction in the display area, and bypassing the hole along the hole edge area.

11. The display device of claim 10, wherein, in the hole edge area, the initialization voltage line is disposed on a same layer as the capacitor electrode.

12. The display device of claim 8, further comprising a scan line disposed on the substrate, extending in the second direction in the display area, and bypassing the hole along the hole edge area.

13. The display device of claim 12, wherein, in the hole edge area, the scan line is disposed on a same layer as the gate electrode.

14. The display device of claim 1, further comprising:
a scan line disposed on the substrate, extending in the second direction in the display area, and bypassing the hole along the hole edge area,
wherein, in the hole edge area:
the at least three of the plurality of first data lines are aggregated with each other to follow a same first path about a portion of the hole,
the at least three of the plurality of second data lines are aggregated with each other to follow a same second path about the portion of the hole,
the scan line follows a third path about the portion of the hole, and
the first path is spaced apart from the second path, and
wherein, when viewed in the third direction:
the third path overlaps at least one of the first path and the second path in a first region of the hole edge area, and
the third path is spaced apart from both the first path and the second path in a second region of the hole edge area.

15. A display device comprising:
a substrate including a display area, in which a hole is formed, and a hole edge area surrounding the hole;
a plurality of first data lines disposed on the substrate, extending in a first direction in the display area, arranged in a second direction orthogonal to the first direction, bypassing the hole along the hole edge area, and including a plurality of (1-1)th data lines and a plurality of (1-2)th data lines; and
a plurality of second data lines disposed on the substrate, extending in the first direction in the display area, arranged adjacent to the plurality of first data lines, bypassing the hole along hole edge area, and including a plurality of (2-1)th data lines and a plurality of (2-2)th data lines,
wherein, in the hole edge area:
each of the plurality of first data lines and each of the plurality of second data lines are disposed in at least four layers different from each other,
each of the plurality of (1-1)th data lines is connected to one side of each of a plurality of first pixels arranged in a first row of the display area,
each of the plurality of (1-2)th data lines is connected to another side of each of the plurality of first pixels arranged in the first row of the display area,
each of the plurality of (2-1)th data lines is connected to one side of each of a plurality of second pixels arranged in a second row located in the first direction from the ifrst row of the display area,
each of the plurality of (2-2)th data lines is connected to another side of each of the plurality of second pixels arranged in the second row located in the first direction from the first row of the display area,
each of the plurality of first data lines overlaps one another in a third direction orthogonal to both the first direction and the second direction, and
each of the plurality of second data lines overlaps one another in the third direction.

16. The display device of claim 15, wherein each of the plurality of first data lines and the plurality of second data lines includes:
a first line disposed on the substrate;
a second line disposed on the first line;
a third line disposed on the second line; and
a fourth line disposed on the third line.

17. The display device of claim 16, wherein the first line, the second line, the third line, and the fourth line extend in the first direction in the display area, and are repeatedly arranged in an order of the first line, the second line, the third line, and third line, and the fourth line.

18. The display device of claim 16, wherein, in the hole edge area, the first line is disposed on a same layer as the metal layer; the second line is disposed on a same layer as the capacitor electrode; the third line is disposed on a same layer as the drain electrode; and the fourth line is disposed on a same layer as the connection electrode.

19. The display device of claim 15, further comprising:
a metal layer disposed in the display area on the substrate;
an active layer disposed on the metal layer;
a gate electrode disposed on the active layer;
a capacitor electrode disposed on the gate electrode;
a drain electrode disposed on the capacitor electrode and connected to the active layer; and
a connection electrode disposed on the drain electrode and connected to the drain electrode.

20. The display device of claim 15, further comprising:
a scan line disposed on the substrate, extending in the second direction in the display area, and bypassing the hole along the hole edge area,
wherein, in the hole edge area:
the first data lines are aggregated with each other to follow a same first path about a portion of the hole,
the second data lines are aggregated with each other to follow a same second path about the portion of the hole,
the scan line follows a third path about the portion of the hole, and the first path is spaced apart from the second path, and
wherein, when viewed in the third direction:
the third path overlaps at least one of the first path and the second path in a first region of the hole edge area, and
the third path is spaced apart from both the first path and the second path in a second region of the hole edge area.

* * * * *